(12) United States Patent
Dunn et al.

(10) Patent No.: US 10,597,335 B2
(45) Date of Patent: Mar. 24, 2020

(54) SEAL COATS TO PREVENT SILICON LOSS DURING RE-MELT INFILTRATION OF SI CONTAINING COMPOSITES

(71) Applicant: GENERAL ELECTRIC COMPANY, Schenectady, NY (US)

(72) Inventors: Daniel Gene Dunn, Guilderland, NY (US); Gregory Scot Corman, Ballston Lake, NY (US); Jared Hogg Weaver, Clifton Park, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 598 days.

(21) Appl. No.: 15/228,693

(22) Filed: Aug. 4, 2016

(65) Prior Publication Data
US 2018/0037513 A1    Feb. 8, 2018

(51) Int. Cl.
*C23C 16/32* (2006.01)
*C04B 37/00* (2006.01)
(Continued)

(52) U.S. Cl.
CPC ............ *C04B 37/005* (2013.01); *B32B 18/00* (2013.01); *C04B 35/573* (2013.01); *C04B 35/6316* (2013.01); *C04B 35/806* (2013.01); *C04B 37/001* (2013.01); *C23C 16/325* (2013.01); *F01D 5/005* (2013.01); *F01D 5/282* (2013.01); *F01D 5/284* (2013.01); *F01D 9/041* (2013.01); *F01D 25/162* (2013.01); *F02K 1/82* (2013.01);
(Continued)

(58) Field of Classification Search
CPC .................................................. C23C 16/325
See application file for complete search history.

(56) References Cited

U.S. PATENT DOCUMENTS

| 3,205,043 A   | 9/1965 | Taylor |
| 4,425,407 A * | 1/1984 | Galasso .................. C04B 35/83 |
| | | 264/81 |

(Continued)

FOREIGN PATENT DOCUMENTS

| EP | 1 561 737 A1  | 8/2005 |
| WO | 2015/065627 A1 | 5/2015 |

OTHER PUBLICATIONS

International Search Report and Written Opinion issued in connection with corresponding PCT Application No. PCT/US2017/043783 dated Nov. 3, 2017.

*Primary Examiner* — Elizabeth A Burkhart
(74) *Attorney, Agent, or Firm* — Fletcher Yoder, P.C.

(57) ABSTRACT

Provided is a method including obtaining ceramic matrix composite (CMC) with a first matrix portion including a silicon carbide and silicon phase dispersed therewithin, disposing a coating thereupon to form a sealed part, and forming thereupon another segment comprising a CMC, which may be another matrix portion including a silicon carbide and a silicon phase dispersed within therewithin. Also provided is a gas turbine component with a CMC segment including a matrix portion including a silicon carbide and a silicon phase dispersed therewithin, a sealing layer including silicon carbide enclosing the first segment, and a second segment on the sealing layer, wherein the second segment includes a melt-infiltrated CMC having a matrix portion including a silicon carbide and a silicon phase dispersed therewithin.

19 Claims, 2 Drawing Sheets

(51) Int. Cl.

| | | |
|---|---|---|
| *F01D 5/28* | (2006.01) | |
| *F02K 9/97* | (2006.01) | |
| *C04B 35/573* | (2006.01) | |
| *F01D 9/04* | (2006.01) | |
| *C04B 35/80* | (2006.01) | |
| *F02K 1/82* | (2006.01) | |
| *F01D 25/16* | (2006.01) | |
| *C04B 35/63* | (2006.01) | |
| *B32B 18/00* | (2006.01) | |
| *F01D 5/00* | (2006.01) | |
| *F23R 3/00* | (2006.01) | |

(52) U.S. Cl.
CPC ............... *F02K 9/97* (2013.01); *F23R 3/007* (2013.01); *C04B 2235/428* (2013.01); *C04B 2235/5244* (2013.01); *C04B 2235/616* (2013.01); *C04B 2237/083* (2013.01); *C04B 2237/365* (2013.01); *C04B 2237/38* (2013.01); *F05D 2220/32* (2013.01); *F05D 2230/80* (2013.01); *F05D 2240/11* (2013.01); *F05D 2300/2261* (2013.01); *F05D 2300/6033* (2013.01)

(56) References Cited

U.S. PATENT DOCUMENTS

| | | | |
|---|---|---|---|
| 5,484,655 | A | 1/1996 | Lau et al. |
| D368,068 | S | 3/1996 | Alden et al. |
| 5,580,834 | A | 12/1996 | Pfaff |
| 6,328,834 | B1 | 12/2001 | Rebstock et al. |
| 6,503,441 | B2 | 1/2003 | Corman et al. |
| 7,686,990 | B2 | 3/2010 | Gray |
| 9,512,505 | B2 | 12/2016 | Weaver et al. |
| 2003/0196305 | A1* | 10/2003 | Kebbede ............ B23P 6/005 29/402.11 |
| 2006/0006212 | A1 | 1/2006 | Thebault et al. |
| 2015/0115489 | A1* | 4/2015 | Corman ............ B23P 6/045 264/36.18 |
| 2015/0115849 | A1 | 4/2015 | Corman |

* cited by examiner

SEAL COATS TO PREVENT SILICON LOSS DURING RE-MELT INFILTRATION OF SI CONTAINING COMPOSITES

FIELD

The invention relates generally to sealing a ceramic matrix composite (CMC) part to prevent loss of silicon from the part during subsequent formation of another CMC segment upon it.

BACKGROUND

Ceramic matrix composites (CMCs), including CMCs that are reinforced with fibers, were developed to alleviate damage tolerance issues of monolithic ceramics such as SiC ceramics and have become attractive for high temperature structural applications, such as in gas turbine engines. One type of fiber-reinforced CMCs that is particularly attractive for high temperature structural applications is reactive melt infiltrated fiber-reinforced CMCs (hereinafter "MI-CMCs").

In MI-CMCs, a preform of fibers and matrix constituents is infiltrated with a metal which produces a ceramic matrix when reacting with the matrix constituents. SiC-based MI-CMCs, wherein the infiltrating metal is silicon or a silicon alloy and the matrix constituents are such that the resulting matrix is substantially SiC (e.g., SiC and/or C particulates), are particularly attractive for high temperature structural applications because of their high thermal conductivity, excellent thermal shock resistance, creep resistance, and oxidation resistance compared to other CMCs.

In gas turbine applications MI-CMC components are often subjected to loads above the matrix cracking stress of the components. The resulting cracks in the matrix portion of the components from such stresses act to decrease the stiffness and oxidation resistance of the MI-CMC composite, and can lead to premature failure of the MI-CMC component. Further, temporary overstress conditions, such as from dropped parts or tools, can occur during MI-CMC component fabrication, transportation and/or installation and also can result in matrix cracks. General wear may also shorten the lifespan of MI-CMC components. Effective methods of repair are therefore needed, so that MI-CMC components that exhibit cracks or other damage can be returned to a suitable state for use rather than needing to be replaced.

One option for repairing MI-CMC components is to fill cracks or refurbish other worn or damaged aspects by performing a MI process on the damaged MI-CMC component. However, an undesirable consequence of such a repair process may be that material such as Si gets lost from original portions of the MI-CMC component, such as by volatilization during an MI process or seepage of silicon into capillaries of an additional MI-CMC segment added to the component being reworked. Thus, a need exists for methods and related configurations, components and assemblies for repairing matrix cracks in MI-CMC components to restore them to a usable condition without loss of Si or other material during repair.

SUMMARY

In one aspect, provided is a method of obtaining a part including a first ceramic matrix composite (CMC) with a first matrix portion wherein the first matrix portion includes a first silicon carbide and a first silicon phase dispersed within the first silicon carbide, sealing the part wherein sealing includes disposing a coating on the part to form a sealed part, and forming on the sealed part a segment comprising a second CMC. In some embodiments, the second CMC may be a second matrix portion including a second silicon carbide and a second silicon phase dispersed within the second silicon carbide.

In another aspect, provided is a method of obtaining a part including a first ceramic matrix composite (CMC) including a first matrix portion wherein the first matrix portion includes a first silicon carbide and a first silicon phase dispersed within the first silicon carbide, sealing the part including disposing a coating on the part to form a sealed part, where disposing includes performing chemical vapor deposition, and the coating includes silicon carbide, forming on the sealed part a segment comprising a second CMC having a second matrix portion including a second silicon carbide and a second silicon phase dispersed within the silicon carbide, and forming includes performing melt infiltration.

In a further aspect, provided is a gas turbine component with a first segment including a ceramic matrix composite (CMC) including a first matrix portion wherein the first matrix portion includes a first silicon carbide and a first silicon phase dispersed within the silicon carbide, a sealing layer including silicon carbide wherein the sealing layer encloses the first segment and comprises an external surface, and a second segment on the external surface of the sealing layer, wherein the second segment includes a melt-infiltrated CMC having a second matrix portion and the second matrix portion includes a second silicon carbide and a second silicon phase dispersed within the silicon carbide.

DRAWINGS

These and other features, aspects, and advantages of the present invention will become better understood when the following detailed description is read with reference to the accompanying drawings, wherein.

DETAILED DESCRIPTION

Figure 1:
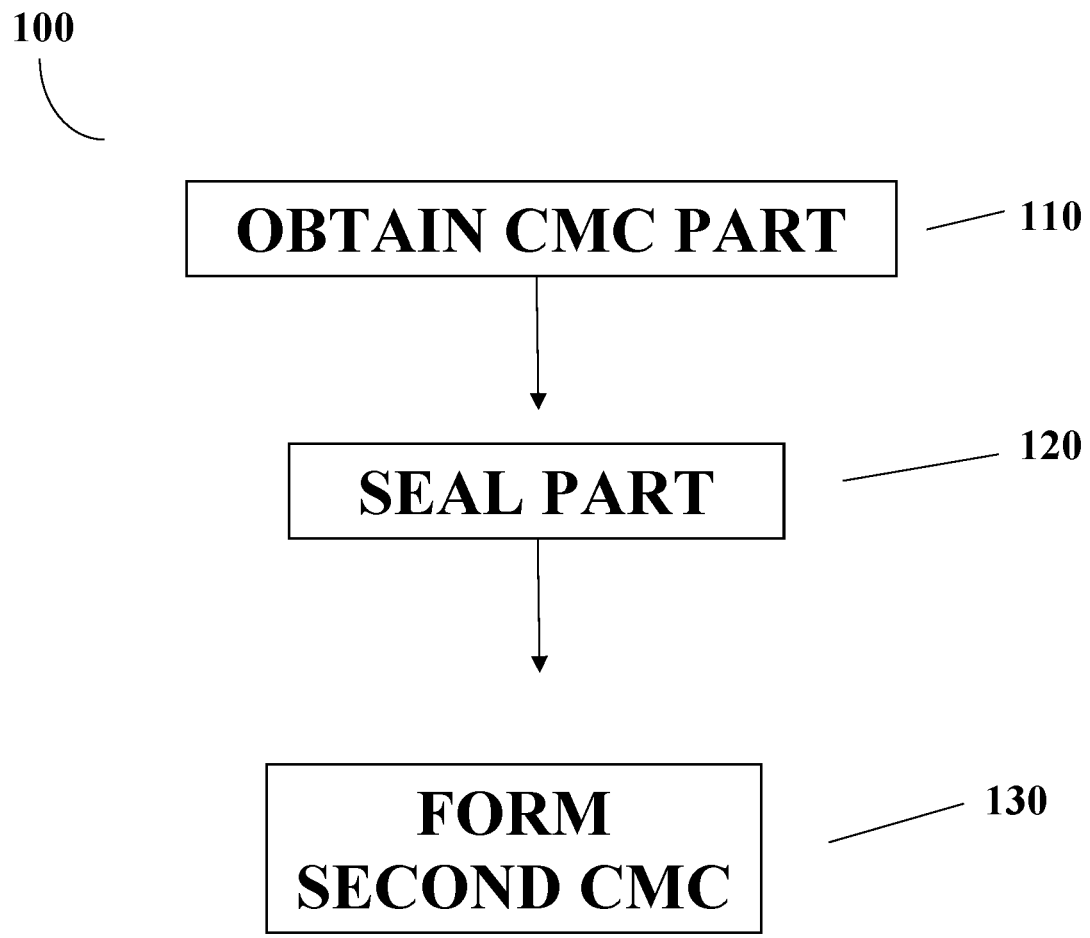
FIG. 1 is a flow-chart illustrating one example of a method for sealing a CMC part and forming a second CMC on the sealed part.

Each embodiment presented below facilitates the explanation of certain aspects of the disclosure, and should not be interpreted as limiting the scope of the disclosure. Moreover, approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value. When introducing elements of various embodiments, the articles "a," "an," "the," and "said" are intended to mean that there are one or more of the elements. The terms "comprising," "including," and "having" are intended to be inclusive and mean that there may be additional elements other than the listed elements. As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable. Any examples of operating parameters are not exclusive of other parameters of the disclosed embodiments. Components, aspects, features, configurations, arrangements, uses and the like described, illustrated or otherwise disclosed herein with respect to any particular embodiment may similarly be applied to any other embodiment disclosed herein.

In one aspect, an embodiment of the present invention includes a method of repairing a CMC component part by an MI process, where the CMC component includes a first matrix portion having a first silicon carbide and a first silicon phase dispersed within the first silicon carbide, sealing the part by disposing a coating on the part to form a sealed part, and forming a segment including a second CMC on the sealed part. A silicon phase is defined herein as containing substantially elemental silicon with any other elements, such as boron, dissolved in the silicon phase. In some embodiments, the second CMC includes a second matrix portion with a second silicon carbide and a second silicon phase dispersed within the second silicon carbide. In some embodiments, the coating may be disposed by a chemical vapor deposition (CVD) process. In some embodiments, the coating may include silicon carbide or silicon nitride. The CMC component part may be a gas turbine part, such as but not limited to a blade, a vane, a nozzle, a shroud, a combustor liner, or a center frame. In some embodiments, the part may be a component in need of repair, and sealing the part by forming a sealing portion or coating on the part is performed during repair of the part.

Forming a second CMC may include performing an MI process to form a second CMC on the sealed part. In some embodiments, a second silicon carbide is melt-infiltrated with a second silicon phase, with melt-infiltrating including disposing silicon on the second silicon carbide, heating the silicon disposed on the second silicon carbide to a first temperature equal to or greater than a melting point of the silicon disposed on the second silicon carbide to form molten silicon disposed on the second silicon carbide, controlling the atmosphere about the part while heating the silicon disposed on the second silicon carbide to the first temperature, allowing the molten silicon disposed on the second silicon carbide to infiltrate the second silicon carbide, and cooling the part to a second temperature that is below the melting point of the silicon that infiltrated the second silicon carbide to form the second silicon phase. For example, the first temperature may be between about 1300° C. and 1600° C., such as between about 1380° C. and 1500° C.

In some embodiments, a second silicon carbide is melt-infiltrated with a second silicon phase, including contacting the second silicon carbide with a wick, wetting the wick with molten silicon at a first temperature equal to or greater than a melting point of silicon, controlling the atmosphere about the part while contacting the second silicon carbide with the wick, infiltrating the second silicon carbide with the molten silicon wherein infiltrating comprises wicking the molten silicon from the wick, and cooling the part to a second temperature that is below the melting point of the silicon that infiltrated the second silicon carbide the to form the second silicon phase.

In another aspect, a gas turbine component has a first segment including a CMC, with a first matrix portion including a first silicon carbide and a first silicon phase dispersed within the first silicon carbide, a silicon carbide sealing layer enclosing the first segment and with an external surface, and a second segment of the external surface of the sealing layer with melt-infiltrated CMC having a second matrix portion with a second silicon carbide and a second silicon phase dispersed within the second silicon carbide. Nonlimiting examples of a gas turbine component include a blade, a vane, a nozzle, a shroud, a combustor liner, and a center frame. A gas turbine may include such a gas turbine component, in accordance with the present disclosure.

In one aspect, a coating deposited on a part to seal the part includes depositing on the part a substance or material with a coefficient of thermal expansion similar to that of the part itself. Substantial differences in coefficients of thermal expansion between a CMC component on which a sealing coating is deposited and material of which a coating is made may result in formation of cracks or fissures during subsequent processing steps and/or use of a component following processing. For example, a CMC may include silicon or a silicon alloy, and may also contain silicon carbide. Examples of materials that may be used for forming a sealing layer on such a CMC include silicon carbide, silicon nitride, and boron carbide.

Various methods known to skilled artisans may be employed to deposit a sealing coating on a CMC part. Any method suitable for depositing a coating with sufficient compatibility and desirable thermal expansion parameters, in view of the composition of the CMC part, may be adopted for such use. A sealing coating is formed to seal in silicon-containing components in the CMC during refurbishing, repair, restructuring, and the like, which may include a subsequent MI step. When an MI step is performed to restructure, repair, rebuild, densify, strengthen, enlarge, or otherwise modify a CMC, such as a CMC component which was itself formed by an MI process, a temperature above the melting point of silicon may be applied. Conventionally, if residual silicon present in the CMC has access to the ambient or furnace environment during such heating, it may evaporate and be lost from the CMC component, resulting in gaps, voids, pockets, or fissures in the CMC component. Also, when reworking or refurbishment entails addition of further CMC segments such as by an MI process, silicon present in the original body of the CMC component may melt at the higher temperatures the component is exposed to during MI and the melted silicon may be pulled into fine capillaries of the added, newly formed "green" CMC material by capillary action. Upon cooling, such silicon may remain in the green CMC portion, leaving voids, fissures, cracks, pores, or other undesirable elements in the original CMC component body.

Applying a sealing coating to the initial CMC component, in accordance with the present invention, separates silicon within the original CMC component from the ambient environment and the green CMC material that may be subsequently deposited during heating, such as during an MI process. Under such circumstances, although the CMC with a sealing coating may be exposed to a temperature above, for example, a melting point of silicon, loss of silicon from the CMC component and formation of faults therein would be reduced, minimized, or eliminated, because a sealing coating would prevent access of volatized silicon, and subsequent loss, to the environment or capillaries of the green CMC segment.

Conventional methods known to those skilled in the art may be used to deposit a sealing coating layer. Such conventional methods may generally include, but should not be limited to, chemical vapor deposition (CVD), chemical vapor infiltration, plasma spraying, high velocity plasma spraying, low pressure plasma spraying, solution plasma spraying, suspension plasma spraying, high velocity oxygen flame (HVOF), electron beam physical vapor deposition (EBPVD), sol-gel, sputtering, slurry processes such as dipping, spraying, tape-casting, rolling, and painting, and combinations of these methods. In a preferred embodiment, a sealing coating layer may be deposited by CVD.

In some embodiments, deposition of a sealing coating layer may include reacting a surface of the CMC component with a compound or chemical. For example, silicon present at or near surfaces of the CMC component may be available for chemical; reactivity with other compounds, presented under suitable conditions. Upon exposure to such compounds under such conditions, such surface-available silicon may react with such compounds or substances to result in the formation of a sealing coating layer at and around the surface of the CMC component, thereby separating silicon on the interior of the CMC component from the ambient environment to prevent subsequent silicon loss due to volatization. For example, methods well known to skilled artisans for carburizing or nitriding surfaces, by exposing a CMC component to carbon or nitrogen under conditions of high heat, may be used to react surface silicon in the CMC component with carbon or nitrogen to form a carburized or nitrided surface. Optionally, subsequent heat treatment may also be applied. Reacting surface silicon in the CMC component with carbon or nitrogen may result in the formation of a sealing coating to prevent loss of interior silicon due to vaporization.

Once a sealing coating has been formed on a surface of a CMC component, additional material may be added to the CMC component, such as for refurbishment, repair, or other modification that includes addition of additional structure to the component. For example, a further segment may be an MI-CMC component. Formation of such additional MI-CMC component may be achieved by any of a variety of methods known to skilled artisans. Nonlimiting examples include processes known as a "prepreg process" and another known as a "slurry cast" process. Processes may differ in how a green composite preform is formed, but in different embodiments a final densification step may involve a silicon melt infiltration step into the green composite preforms for the added MI-CMC segment.

Once a green body composite preform containing the fibers and matrix constituents is formed, it is heated while in contact with a source of silicon metal or alloy which produces a ceramic matrix when reacting with the matrix constituents. The molten infiltrating silicon phase readily wets the matrix constituents (e.g., SiC and/or carbon matrix constituents) of the green body composite preform, and therefore is easily pulled into a portion of the porosity of the preform by capillary action. No external driving force is typically needed for the infiltration of silicon into the matrix constituents and there is typically no dimensional change of the composite preform as a result of the infiltration (as the porosity of the preform is filled with silicon). Current conventional processes for melt infiltration of fiber-reinforced CMCs using silicon (e.g., silicon metal or alloy) utilize batch processes where either silicon metal powder is applied onto the surface of the preform, or silicon is transferred to the preform in the molten state using a porous carbon wick.

Conventionally, performing such steps may result in loss of silicon phase from the original CMC component body. In accordance with the present invention, sealing the original CMC component with a sealing layer prevents such loss and resultant formation of faults within the original CMC component segment. Thus, silicon may be added during densification of the newly formed CMC component during an MI step by adding exogenous silicon, not by siphoning silicon off of the original CMC component, which retains its silicon phase.

Upon infiltration of molten silicon, such as via capillary action during the silicon infiltration processes discussed above, the silicon is drawn into some of the porosity of the matrix constituents of the newly formed CMC and may react with carbon thereof to form a SiC-based MI-CMC component with a matrix portion including a substantially SiC crystalline structure about the fibers (e.g., SiC fibers). In addition to forming a ceramic SiC crystalline structure of a matrix portion, the silicon infiltration process fills at least some of the remaining porosity of the matrix portion with silicon metal or alloy that does not react with carbon of the constituents. In this way, interconnected pockets of "free" or un-reacted silicon phase may be formed within the matrix portion. In this way, a matrix portion of some exemplary SiC-based, newly added MI-CMC segments may be a substantially Si—SiC matrix portion. In some embodiments, infiltrated "free" silicon phase in such matrix portion (i.e., Si that does not form SiC) may be about 2 vol % to about 50 vol % of a matrix portion, and more preferably about 5 vol % to about 35 vol % of a matrix portion, and even more preferably about 7 vol % to about 20 vol % of a matrix portion.

Silicon may be disposed on the matrix portion of a newly added MI-CMC component, which itself is formed on a sealed coated original CMC component, then exposed to a temperature above the melting point of silicon, forming molten silicon. Molten silicon is then allowed to disperse into the matrix portion of the added MI-CMC segment. In another embodiment, silicon may be contacted to a wick then exposed to a temperature above the melting point of silicon to form molten silicon, which, by capillary action, may be drawn into the matrix portion of the newly added MI-CMC component segment, itself formed upon the sealed coated original CMC component segment. Molten silicon may be formed by exposing silicon on the newly formed matrix portion, MI-CMC segment, or wick contacting the silicon to such segment, to a temperature of between 1300° C. and 1600° C. For example, a temperature of between 1380° C. and 1500° C. may be attained. Temperatures outside these ranges may also be used. When it is no longer desirable or needed for silicon to remain in a molten form, the temperature may be lowered to a temperature below the melting point of silicon to permit it to solidify, such as distributed among and within matrix components of the newly formed MI In some embodiments, densifying the newly formed MI-CMC may include controlling the atmosphere about such component while it is heated. In some embodiments controlling the atmosphere about the component while the component is heated may include heating the component in a vacuum furnace. In some such exemplary embodiments, the vacuum furnace may be configured to heat the component in a non-oxidizing atmosphere (i.e. the residual gases within the furnace have no significantly deleterious effect on the infiltrating silicon). In some embodiments the furnace may be configured to heat the component in an inert gas atmosphere. In some embodiments the furnace may be configured to heat the component in a vacuum to substantially remove gas that is trapped or formed within the newly formed MI-CMC component. For example, in some embodiments the furnace may be configured to heat the component in a vacuum within the range of about 0.01 torr to about 2 torr, and preferably within the range of about 0.1 torr to about 1 torr.

An embodiment of a process of the present disclosure is illustrated in FIG. 1. Shown is a process 100 involving addition of a second CMC segment to an original CMC part or component after the original CMC part has been coated with a sealing portion or layer. In this embodiment, a CMC part or component is obtained 110. Optionally, the part or component may be in need of repair or refurbishment. It may have been damaged during use, such as by the wearing away or breakage of a portion or portions or by formation of cracks or fissures. Some repairs may be effectuated by incorporating additional silicon phase within the part, such as by an MI process, before additional structure is added to the CMC component, in accordance with known methods.

Subsequently, a surface of the original CMC component may be sealed by application of a coating layer 120. As described above, a coating layer may be selected to possess a coefficient of thermal expansion substantially similar to that of the original CMC component. A sealing coating may comprise silicon carbide, silicon nitride, or boron carbide, or another material, or may be formed by carburization or nitriding of the surface of the CMC component. The sealing coating may be totally nonporous so as to form a complete barrier between silicon of the silicon phase of the original CMC component. Optionally, in some embodiments, a sealing coating layer may be formed on only a portion of the CMC component, such as to form a barrier between the silicon of the silicon phase of the original CMC and an MI-CMC formed on the other side of the sealing coating layer from the original CMC component which does not otherwise contact the original CMC component or layer thereupon. In this manner, wicking of silicon phase from the original CMC component into a newly formed MI-CMC component segment may be prevented, without requiring total sealing of the original CMC component. In other embodiments, a sealing coating layer may be substantially total or complete around all surfaces of the original CMC component, yet possess some porosity, while still retaining the ability to prevent, minimize, or reduce loss of silicon phase from the original CMC component due to volatization during subsequent heating steps, such as during MI processing.

After formation of a sealing coating layer, a further CMC component may be formed 130 as described above. The coefficient of thermal expansion of the sealing coating layer may be substantially similar to that of the CMC component segment added during this step. The added CMC component segment is formed on a surface of the sealing coating layer opposite from that which contacts the original CMC component. In this way, the added CMC component may be considered to be external to the original CMC component, as opposed to matrix or silicon phase of the original CMC component, which may be considered to be internal to the original CMC component.

Figure 2A:
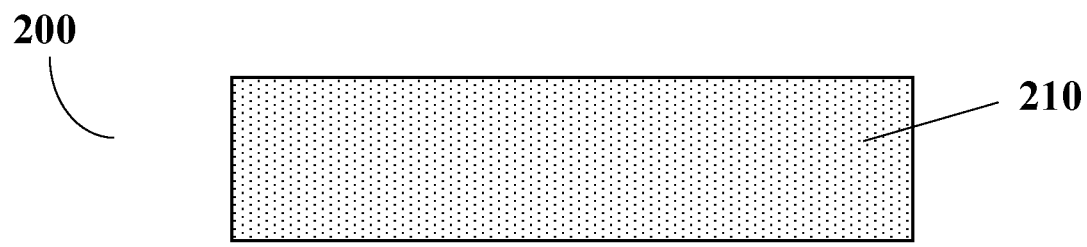
FIG. 2A is an illustration of a CMC component part of gas turbine engine.
Figure 2B:
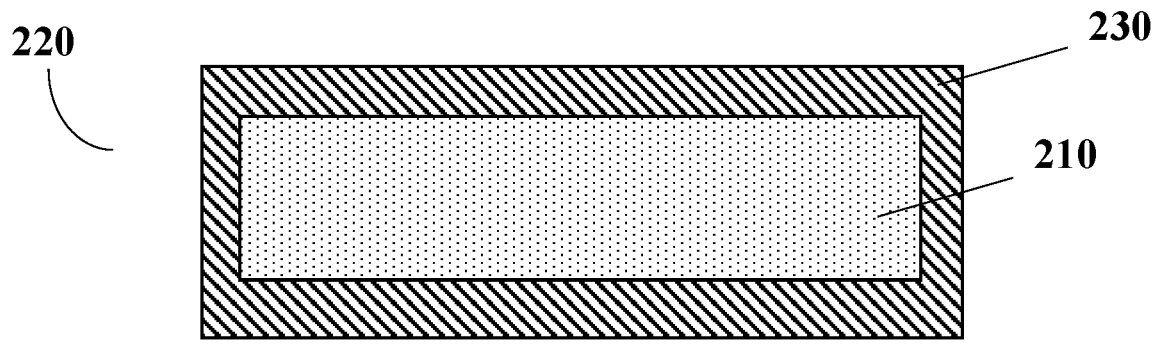
FIG. 2B is an illustration of a CMC component part of gas turbine engine on which a coating has been disposed to seal the part.
Figure 2C:
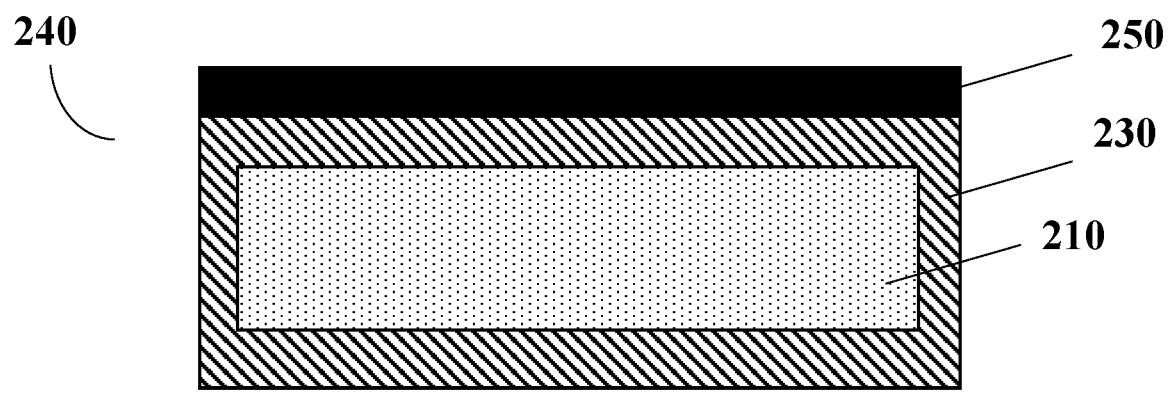
FIG. 2C is an illustration of a CMC component part of gas turbine engine on which a coating has been disposed to seal the part with a second CMC on the external surface of the sealing part.

An embodiment of a component formed during such processing is illustrated in FIG. 2A, FIG. 2B, and FIG. 2C. Shown in FIG. 2A is a CMC component 210 in an initial state 200 such as if it is in need of repair, refurbishment, or reworking. In FIG. 2B, shown is a CMC component 210 upon which a sealing coating layer 230 has been deposited, representing a state of the component part-way through the process 220. In FIG. 2C, shown is the addition of a second, newly formed CMC component 250, such as by an MI process, as repair, refurbishment, or remodeling of the component continues 240. Different portions, segments, or layers are shown for exemplary illustrative purposes and are not to scale. Any CMC component may be represented by the forms illustrated in FIGS. 2A-2C, including a gas turbine component such as a blade, a vane, a nozzle, a shroud, a combustor liner, and a center frame, or another component. Any of the foregoing components may be assembled into and rendered part of a gas turbine in accordance with the present disclosure.

It is to be understood that the above description is intended to be illustrative, and not restrictive. Numerous changes and modifications may be made herein by one of ordinary skill in the art without departing from the general spirit and scope of the invention as defined by the following claims and the equivalents thereof. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Also, the term "operably" in conjunction with terms such as coupled, connected, joined, sealed or the like is used herein to refer to both connections resulting from separate, distinct components being directly or indirectly coupled and components being integrally formed (i.e., one-piece, integral or monolithic). Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the disclosure may include only some of the described embodiments. Accordingly, the invention is not to be seen as limited by the foregoing description, but is only limited by the scope of the appended claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method comprising:
    sealing a part, wherein the part comprises a first ceramic matrix composite (CMC) including a first matrix portion, wherein the first matrix portion comprises a first silicon carbide and a first silicon phase dispersed within the first silicon carbide, and sealing comprises disposing a coating on a surface of the part to form a sealed part, wherein the coating is configured to minimize wicking of the first silicon phase, and
    forming on the sealed part a segment comprising a second CMC.

2. The method of claim 1, wherein the coating comprises silicon carbide.

3. The method of claim 1, wherein disposing comprises depositing silicon carbide as the coating on the surface of the part using chemical vapor deposition.

4. The method of claim 1, wherein the segment comprising the second CMC includes a second matrix portion, wherein the second matrix portion comprises a second silicon carbide and a second silicon phase dispersed within the second silicon carbide.

5. The method of claim 4, wherein forming comprises melt-infiltrating the second silicon carbide with the second silicon phase, and wherein melt-infiltrating comprises:
    disposing silicon on the second silicon carbide,
    heating the silicon disposed on the second silicon carbide to a first temperature equal to or greater than a melting point of the silicon disposed on the second silicon carbide to form molten silicon disposed on the second silicon carbide,
    controlling the atmosphere about the part while heating the silicon disposed on the second silicon carbide to the first temperature,
    allowing the molten silicon disposed on the second silicon carbide to infiltrate the second silicon carbide, and
    cooling the part to a second temperature that is below the melting point of the silicon that infiltrated the second silicon carbide to form the second silicon phase.

6. The method of claim 5, wherein the first temperature is between about 1300° C. and 1600° C.

7. The method of claim 6, wherein the first temperature is between about 1380° C. and 1500° C.

8. The method of claim 4, wherein forming comprises melt-infiltrating the second silicon carbide with the second silicon phase, and wherein melt-infiltrating comprises:
    contacting the second silicon carbide with a wick,
    wetting the wick with molten silicon at a first temperature equal to or greater than a melting point of silicon,
    controlling the atmosphere about the part while contacting the second silicon carbide with the wick,
    infiltrating the second silicon carbide with the molten silicon wherein infiltrating comprises wicking the molten silicon from the wick, and
    cooling the part to a second temperature that is below the melting point of the silicon that infiltrated the second silicon carbide to form the second silicon phase.

9. The method of claim 8, wherein the first temperature is between about 1380° C. and 1500° C.

10. The method of claim 1, wherein the part is a gas turbine part.

11. The method of claim 10, wherein the part is selected from the group consisting of a blade, a vane, a nozzle, a shroud, a combustor liner, and a center frame.

12. The method of claim 1, wherein the part is a component in need of repair and sealing and forming comprise repairing the component.

13. The method of claim 1, wherein forming comprises performing melt-infiltration.

14. The method of claim 13, wherein the part is a gas turbine part selected from the group consisting of a blade, a vane, a nozzle, a shroud, a combustor liner, and a center frame.

15. The method of claim 1, wherein the coating has a thermal expansion coefficient that is substantially similar to the thermal expansion coefficient of the first CMC.

16. The method of claim 1, wherein the coating is non-porous.

17. The method of claim 1, wherein sealing comprises disposing the coating on all surfaces of the part to form the sealed part.

18. A method comprising:
    sealing a part, wherein the part comprises a first ceramic matrix composite (CMC) including a first matrix portion, wherein the first matrix portion comprises a first silicon carbide and a first silicon phase dispersed within the first silicon carbide, and sealing comprises disposing a coating on a surface of the part to form a sealed part, disposing comprises performing chemical vapor deposition, and the coating comprises silicon carbide, and wherein the coating is configured to minimize wicking of the first silicon phase;
    forming, on the sealed part, a segment comprising a second CMC having a second matrix portion, wherein the second matrix portion comprises a second silicon carbide and a second silicon phase dispersed within the silicon carbide, and wherein forming comprises performing melt infiltration.

19. The method of claim 18, wherein the part is a gas turbine part selected from the group consisting of a blade, a vane, a nozzle, a shroud, a combustor liner, and a center frame.

* * * * *